US010763823B2

(12) United States Patent
Shoemaker et al.

(10) Patent No.: US 10,763,823 B2
(45) Date of Patent: Sep. 1, 2020

(54) ELLIPTICALLY-SHAPED RESONATOR MARKERS WITH ENHANCED FREQUENCY STABILITY AND GAIN

(71) Applicant: 3M INNOVATIVE PROPERTIES COMPANY, St. Paul, MN (US)

(72) Inventors: Curtis L. Shoemaker, Round Rock, TX (US); Ding Wang, Austin, TX (US); Ziyad H. Doany, Austin, TX (US)

(73) Assignee: 3M Innovative Properties Company, St. Paul, MN (US)

( * ) Notice: Subject to any disclaimer, the term of this patent is extended or adjusted under 35 U.S.C. 154(b) by 163 days.

(21) Appl. No.: 16/064,839

(22) PCT Filed: Dec. 15, 2016

(86) PCT No.: PCT/US2016/066879
§ 371 (c)(1),
(2) Date: Jun. 21, 2018

(87) PCT Pub. No.: WO2017/116739
PCT Pub. Date: Jul. 6, 2017

(65) Prior Publication Data
US 2019/0007028 A1    Jan. 3, 2019

Related U.S. Application Data

(60) Provisional application No. 62/272,782, filed on Dec. 30, 2015.

(51) Int. Cl.
*H03H 9/24* (2006.01)
*G01V 3/08* (2006.01)
(Continued)

(52) U.S. Cl.
CPC ............... *H03H 9/24* (2013.01); *G01V 3/081* (2013.01); *G08B 13/2408* (2013.01); *H01F 1/153* (2013.01)

(58) Field of Classification Search
CPC .......... H03H 9/24; H01F 1/153; G08B 13/24; G08B 13/2408; G01V 3/08; G01V 3/081
See application file for complete search history.

(56) References Cited

U.S. PATENT DOCUMENTS 4,940,966 A    7/1990  Pettigrew
5,469,140 A   11/1995  Liu et al.
(Continued)

FOREIGN PATENT DOCUMENTS

CN    201364633 Y    12/2009
JP       09205014     8/1997
(Continued)

OTHER PUBLICATIONS

Search Report for CN Appl. No. 201680077796.8, dated Nov. 26, 2019, 2 pp.
(Continued)

*Primary Examiner* — Son T Le
(74) *Attorney, Agent, or Firm* — Gregg H. Rosenblatt

(57) ABSTRACT

A magnetoelastic resonator device comprises a housing, at least one elliptically-shaped or substantially elliptically-shaped magnetoelastic element disposed within the housing, and at least one bias magnet disposed in the housing, wherein the at least one elliptically-shaped or substantially elliptically-shaped magnetoelastic element is configured to couple to an external magnetic field at a particular frequency and convert the magnetic energy into mechanical energy, in the form of oscillations.

15 Claims, 13 Drawing Sheets

(51) Int. Cl.
*H01F 1/153* (2006.01)
*G08B 13/24* (2006.01)

(56) References Cited

U.S. PATENT DOCUMENTS

| | | | |
|---|---|---|---|
| 5,557,974 A | 9/1996 | Hase | |
| 5,600,239 A * | 2/1997 | Hathaway | G01R 33/18 324/209 |
| 6,420,202 B1 | 7/2002 | Barber | |
| 2002/0140558 A1 | 10/2002 | Lian | |
| 2009/0195386 A1 * | 8/2009 | Peter | G08B 13/2408 340/572.1 |
| 2012/0068823 A1 | 3/2012 | Doany | |
| 2012/0325359 A1 | 12/2012 | Doany | |
| 2013/0099790 A1 | 4/2013 | Doany | |

FOREIGN PATENT DOCUMENTS

| | | |
|---|---|---|
| JP | 2006214995 | 8/2006 |
| JP | 2015201985 | 11/2015 |
| WO | 2016-182815 | 11/2016 |
| WO | 2017-116736 | 7/2018 |

OTHER PUBLICATIONS

Shoemaker, "Comparison of Ellipse (laser cut) vs Rectangular (shear cut) Resonators—Part II", 2015, 1-30 pages.
International Search Report for PCT International Application No. PCT/US2016/066879, dated Apr. 10, 2017, 3 pages.
Search Report for RU Appl. No. 2018121307, dated May 21, 2019, 2 pp.

* cited by examiner

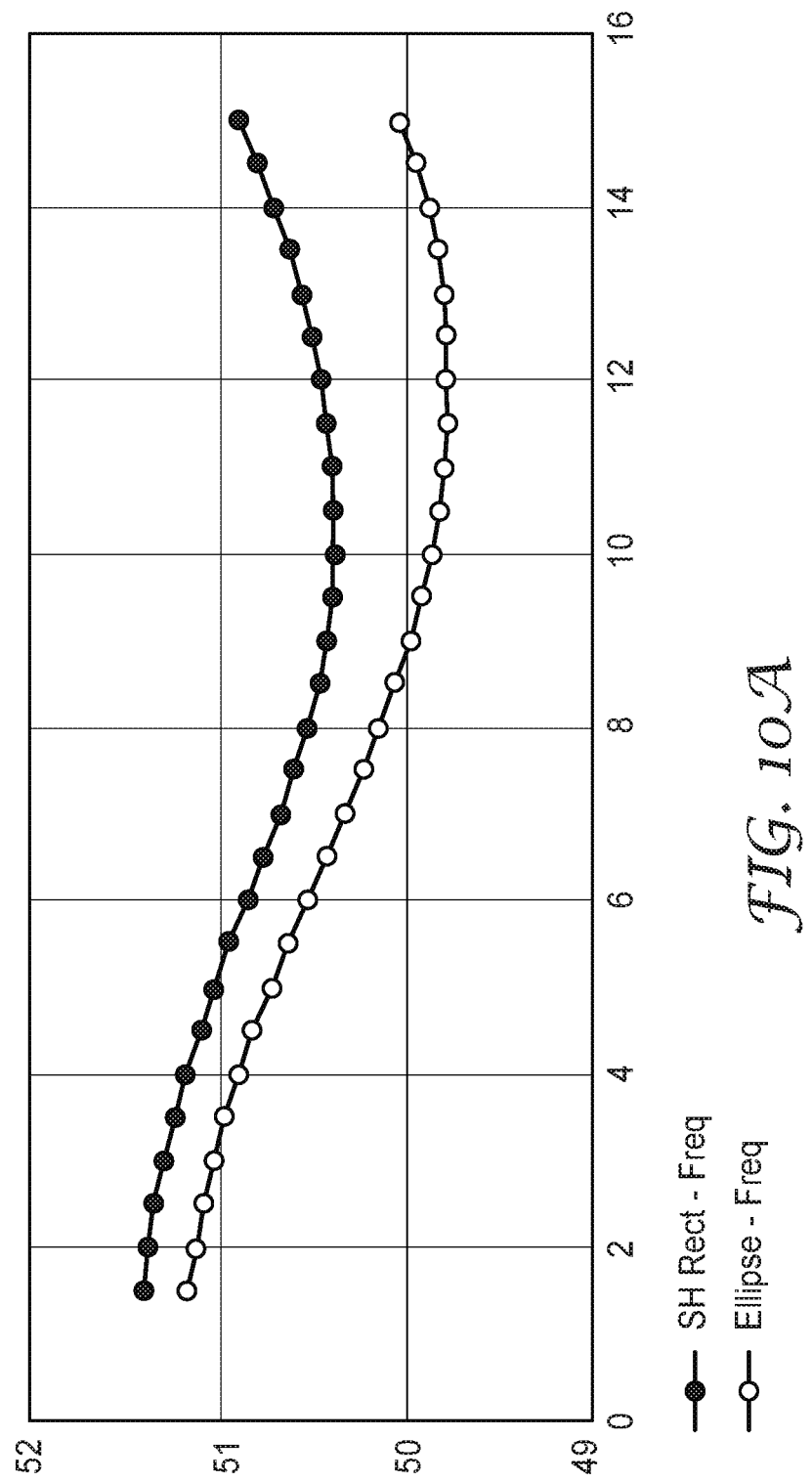

ELLIPTICALLY-SHAPED RESONATOR MARKERS WITH ENHANCED FREQUENCY STABILITY AND GAIN

BACKGROUND

Magneto-mechanical resonators (MMRs), also referred to as magnetoelastic (MEL) resonators, are well known and have been used in retail security applications for decades. In addition, MEL resonators are also suitable for buried infrastructure due to their low cost, low profile and flexible components. They can be configured as stand-alone markers or physically attached to an underground pipe or utility. They can be used to identify a buried asset and its location accurately. For example, see US 2012/068823; US 2012/0325359; and US 2013/0099790, each of which is incorporated herein by reference in its entirety.

However, the detection range and frequency stability of such conventional MEL resonators can be limited.

SUMMARY OF THE INVENTION

In a first aspect of the invention, a magnetoelastic resonator device, comprises a housing; at least one elliptically-shaped or substantially elliptically-shaped magnetoelastic element disposed within the housing; and at least one bias magnet disposed in the housing, wherein the at least one elliptically-shaped magnetoelastic element is configured to couple to an external magnetic field at a particular frequency and convert the magnetic energy into mechanical energy, in the form of oscillations.

In another aspect, the at least one elliptically-shaped or substantially elliptically-shaped magnetoelastic element comprises at least two elliptically-shaped or substantially elliptically-shaped magnetoelastic elements in a stacked arrangement.

In another aspect, the elliptically-shaped or substantially elliptically-shaped magnetoelastic element comprises an amorphous magnetic material.

In another aspect, the elliptically-shaped or substantially elliptically-shaped magnetoelastic element is shaped via one of laser machining, tool cutting and stamping In yet another aspect of the invention, a magnetoelastic resonator device comprises at least one elliptically-shaped or substantially elliptically-shaped magnetoelastic element having a first lengthwise end and a second lengthwise end. The resonator device also comprises a first bias magnetic element disposed adjacent to the first lengthwise end of the at least one elliptically-shaped or substantially elliptically-shaped magnetoelastic element and a second bias magnetic element disposed adjacent to the second lengthwise end of the at least one elliptically-shaped or substantially elliptically-shaped magnetoelastic element. The resonator device also comprises a substrate to support the at least one elliptically-shaped or substantially elliptically-shaped magnetoelastic element and first and second bias elements.

In another aspect, the at least one elliptically-shaped or substantially elliptically-shaped magnetoelastic element comprises at least two elliptically-shaped or substantially elliptically-shaped magnetoelastic elements in a stacked arrangement.

In another aspect, the magnetoelastic resonator device further comprises a displacement restriction element disposed in a central lengthwise region of the stacked arrangement to restrict displacement of the at least two magnetoelastic elements with respect to each other at the central lengthwise region, wherein the first and second ends experience flaring movement. In another aspect, the displacement restriction element suspends each element from each other at the central lengthwise region. In another aspect, the displacement restriction element comprises at least one pin extending through each of the plurality of ferromagnetic elements.

In another aspect, each of the elliptically-shaped or substantially elliptically-shaped magnetoelastic elements comprises an amorphous magnetic material.

In yet another aspect of the invention, a linear array magnetoelastic resonator device comprises a first plurality of elliptically-shaped or substantially elliptically-shaped elements disposed in a first stacked arrangement, each element having a first lengthwise end and a second lengthwise end and a second plurality of elliptically-shaped or substantially elliptically-shaped elements disposed in a second stacked arrangement, each element having a first lengthwise end and a second lengthwise end. The linear array magnetoelastic resonator device further comprises a first bias magnetic element disposed adjacent to the first lengthwise end of the first stacked arrangement and a second bias magnetic element disposed adjacent to the second lengthwise ends of the first stacked arrangement, wherein the second bias magnetic element is also disposed adjacent to the first end of the second stacked arrangement, and a third bias magnetic element disposed adjacent to the second lengthwise end of the second stacked arrangement.

In another aspect, any of the preceding resonator devices further comprises a housing to enclose the resonator device. In another aspect, the housing is formed from a non-rigid material. In another aspect, the housing has sufficient flexibility to be mounted to a coiled pipe.

In another aspect, any of the preceding resonator devices has a frequency range of from about 34 kHz to about 80 kHz.

In another aspect, any of the preceding resonator devices can be detected at a depth up to about 48 inches underground.

In another aspect, a magnetoelastic resonator marker system comprises any of the preceding magnetoelastic resonator devices and a portable locating device.

In another aspect, any of the preceding resonator devices can be attached to an asset buried underground.

In yet another aspect of the invention, an elliptical plate magnetoelastic resonator comprises at least one elliptical plate formed from an amorphous magnetic material.

In yet another aspect of the invention, a magnetoelastic sensor comprises at least one elliptical plate magnetoelastic resonator or at least any of the preceding magnetoelastic resonator devices.

The above summary of the present invention is not intended to describe each illustrated embodiment or every implementation of the present invention. The figures and the detailed description that follows more particularly exemplify these embodiments.

BRIEF DESCRIPTION OF THE DRAWINGS

The invention will be described hereinafter in part by reference to non-limiting examples thereof and with reference to the drawings, in which:

FIGS. 10A and 10B are plots of the frequency stability of the elliptical and rectangular resonator devices as a function of bias field.

Figure 1:
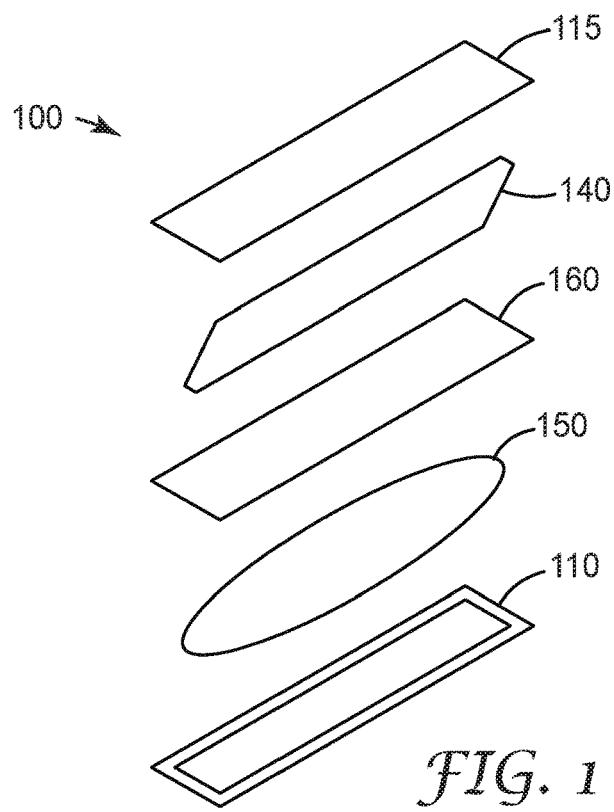
FIG. 1 is an exploded view of a magnetoelastic resonator device according to a first aspect of the invention.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the invention as defined by the appended claims.

DETAILED DESCRIPTION OF EMBODIMENTS

In the following description, reference is made to the accompanying drawings, which form a part hereof, and in which is shown by way of illustration specific embodiments in which the invention may be practiced. In this regard, directional terminology, such as "top," "bottom," "front," "back," "leading," "forward," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

A magnetoelastic (MEL) resonator-based marker ("MEL marker" for short) with extended signal range for use in locating and identifying assets, such as buried assets, is described herein. An elliptically-shaped resonator strip is utilized and provides improved gain as compared to a standard rectangular-shaped resonator strip when of similar aspect ratio. Such a MEL marker can be suitable for buried infrastructure due to its low cost, low profile and flexible components. Further, the MEL markers described herein can provide frequency tunability, high frequency stability, high energy storage, and a low profile, all in combination with extended detection range over conventional MEL markers with rectangular-shaped resonator strips. The MEL marker can be a stand-alone marker, it can be physically attached to an underground asset, such as a pipe or other utility, or it can be attached to another device or carrier, such as caution or warning tape, located at or near the underground asset.

Different resonator shapes, as used within a magnetoelastic (MEL) marker, are described, and the advantages and benefits of the elliptical shape are described. In comparing rectangular and elliptical shapes, there is no unique geometrical comparison. The investigators have chosen to compare resonators in which the aspect ratio of the two resonator strip shapes are similar, and the resonant frequencies are close. Similar aspect ratio, as used here, is described as: (1) the principal axes of the ellipse extend beyond the edges of the rectangular shape; and (2) the four corners of the rectangle extend beyond the ellipse. This is a practical comparison from the viewpoint of operating in a given frequency band while providing a similar sized resonator for packaging. Under these practical circumstances the investigators have determined that the elliptical shape provides observable advantages in variability and signal gain. If another geometrical criterion is chosen for comparison (such as fixed width and same frequency), then the signal gain advantages are lessened, but the improvement in variability is maintained. This improved variability is an important attribute of the present invention, as it has practical implications in the use of low cost amorphous materials in locating and marking and sensor applications, for which lack of resonator consistency can limit performance.

In particular, as described in further detail herein, elliptically-shaped magnetoelastic resonators of amorphous magnetic material have been shown to outperform rectangular shaped resonators of similar size, aspect ratio, and resonant frequency. The higher performance is manifested as higher signal gain, and generally higher level of consistency of dynamic properties and frequency in particular. The signal gain is improved by using an elliptically-shaped for single resonator devices and multiple resonator devices.

Figure 2:
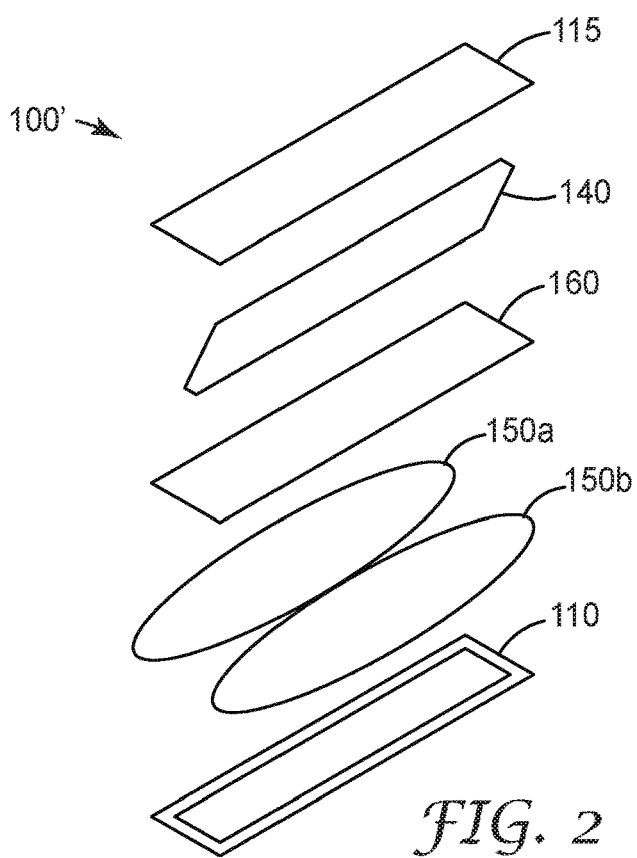
FIG. 2 is an exploded view of a magnetoelastic resonator device according to another aspect of the invention.

FIGS. 1 and 2 respectively show first and second aspects of the present invention, MEL marker devices 100 and 100', in an exploded view. MEL marker device 100 includes a housing 110 that encloses at least one elliptically shaped magnetoelastic resonator material or element 150, also referred to as a resonator strip, and a bias magnet 140 therein. As shown in FIG. 2, in another aspect of the invention, MEL marker device 100' can include two elliptically shaped resonator strips 150a and 150b. In further aspects of the invention, three or more resonator strips 150 can be included in MEL marker device. As is understood, a MEL resonator device is designed to couple to an external magnetic field at a particular frequency and convert the magnetic energy into mechanical energy, in the form of oscillations of the resonator strip(s). The radiated energy from the oscillating strip(s) can then be detected by a detection device.

In a preferred aspect, resonator strip 150 is elliptically shaped. As such, this elliptical shape provides for a more uniform magnetic field inside the resonator material, as an elliptical shape (elliptical plate, in this case) exhibits uniform magnetization when immersed in a uniform magnetic field. In contrast, conventional rectangular resonator strips exhibit a highly variable magnetic field within the resonator material due to poles induced on the sample ends. As such, the magnetorestriction is a weighted average of low values near the rectangle ends and higher values in the central portion. Further, this variation in both DC magnetic bias and AC signal (as there are both induced DC and AC poles) may lead to increased variability from resonator to resonator, due to how this variation interacts with spatial variations of magnetic properties inside the material. As shown in greater detail below in the experiment section, elliptically shaped resonator materials exhibit higher gain than rectangular resonator materials when of similar aspect ratio.

As mentioned, an elliptically shaped magnet exhibits uniform magnetic fields. For MEL marker devices, this applies to both the bias field (DC) and an applied AC signal. These more uniform fields may lead to less variation in the observed magneto restriction (e.g., stronger magnetorestriction near the ends of the elliptically shaped resonator material) and less variation of the dynamic parameters of the resonator. Less variation in markers or sensors, in turn, leads to higher application performance, in general. These properties will be described in further detail in the Experiment section. In another aspect of the invention, resonator strip 150 does not have to have a full ellipse shape, but can instead have rounded edges on its ends, with a main body that is not a full ellipse. In this aspect, such rounded corners begin to approach the behavior of the ideal elliptical shape, and thus provide a level of the same benefit as the elliptical plate resonator.

In one aspect of the present invention, MEL marker device housing 110 provides a structure for protecting the MEL resonator from surrounding environmental conditions when used for particular applications, such as underground and buried infrastructure locating and marking.

In particular, the housing 110 includes a cover portion 115 and a separator portion 160 disposed between the housing base and the cover portion 115. The separator portion 160 provides a physical separation between the at least one elliptically shaped resonator strip 150 and a magnetic bias material 140.

MEL resonator strip 150 comprises a ferromagnetic material with magnetostrictive properties, such as a magnetic amorphous alloy or crystalline material such as Metglas 2826 MB, 2605SA1 or 2605S3A made by Metglas, Inc. of Conway, S.C. Resonator strip 150 can also comprise a similar material, such as those made by Vacuumschmelze GmbH of Hanau, Germany. The physical dimensions, such as the length, width, and thickness, of the resonator strip(s) can be chosen based on the desired response frequency.

As mentioned above, MEL resonator strip(s) 150 are elliptically shaped, or at least substantially elliptically shaped (i.e., they are not necessarily formed as a perfect ellipse, but have rounded ends without sharp corners). Such shaping can be accomplished in a variety of ways, including laser machining, tool cutting and stamping. As mentioned above, the rounded edges at the strip ends help produce a more uniform magnetorestriction at those ends and thus help increase the overall strip magnetorestriction, while improving part to part consistency of the dynamic parameters.

The resonator strip material is magnetically biased by a magnetic bias material 140, such as a permanent magnet or a magnetically hard or semi-hard metal strip. A magnetically hard magnetic bias material 140 that is not readily changeable can be utilized herein because its bias characteristics are unlikely to change when buried underground. The magnetic bias layer 140 can be made from any magnetic material that has sufficient magnetic remanence when magnetized to appropriately bias the resonators, and sufficient magnetic coercivity so as to not be magnetically altered in normal operating environments. A commercially available magnetic material such as Arnokrome™ III from The Arnold Engineering Company of Marengo, Ill., can be utilized, though other materials could serve equally well. The magnetic bias layer 140 can have dimensions similar to those of resonator strip(s) 150. As with linear or bar magnets, magnetic bias layer 140 has magnetic poles, one at each end.

The housing 110, and its components, can be formed from a plastic or any other non-conductive material, such as PVC, or other polymers. In one aspect, the housing can be formed using a conventional vacuum forming process. In a preferred aspect, the housing material can maintain its shape and spacing around the resonator strip and bias material. In addition, the housing and component material can be formed as a non-rigid or flexible structure, either as a result of material composition or thickness of the housing walls. For example, the spacer elements 125 can be formed as non-rigid or flexible structures.

In a further aspect of the invention, the MEL marker device 100, 100' can be placed within a protective capsule or outer housing designed to withstand rugged conditions. The protective capsule can be formed from a rugged material, such as high density polyethylene (HDPE).

MEL marker device 100, 100' can be disposed on or near an underground asset, such as a pipe, conduit, or other facility. For example, MEL marker device 100, 100' can be a stand-alone marker, it can be physically attached to an underground asset, such as a pipe or other utility, or it can be attached to another device, such as caution or warning tape, located at or near the underground asset. In addition, the MEL marker devices described herein can be utilized in non-underground environments, such as for use in locating and identifying above-ground assets otherwise hidden from view (such as in a container or within a building wall, ceiling, or floor).

Moreover, the MEL marker device 100, 100' can be specifically designed to operate at different frequencies which are associated with unique asset types such as different utility infrastructure (e.g., water, waste water, electric, telephone/cable/data, and gas). For example, in one aspect, the MEL marker device 100, 100' can have a frequency range of from about 34 kHz to about 80 kHz. It is noted that for locating applications, frequency shifts are not desirable where multiple MEL marker devices may be combined to achieve additional detection depth. Accordingly, the MEL marker devices disclosed herein can be clustered (for additional depth), without demonstrating substantial frequency shifts. In addition, especially for pipe locating applications, the MEL marker devices can be employed to provide not only asset location, but also asset directionality due to the vector nature of the magnetic response.

While a magnetoelastic marker embodiment has been described, the present invention is also applicable to resonators in MEL based sensors. In alternative aspects, MEL marker device 100, 100' can be utilized as part of a sterilization indicator system that provides time, temperature, and/or chemical information. In a further alternative aspect, MEL marker device 100, 100' can be utilized as part of a perishable (e.g., food spoilage) indicator system that provides time and temperature information. In a further alternative aspect, MEL marker device 100, 100' can be utilized as part of a leak detection system that provides leak information for above or below ground utilities. For example, in this particular aspect, the MEL marker device 100, 100' can further incorporate an embedded antenna to wirelessly communicate sensor information. Alternatively, the MEL marker device 100, 100' can be designed to be physically affected by changing conditions so that a signal response may vary over time or conditions, indicating certain information to the user.

Figure 3A:
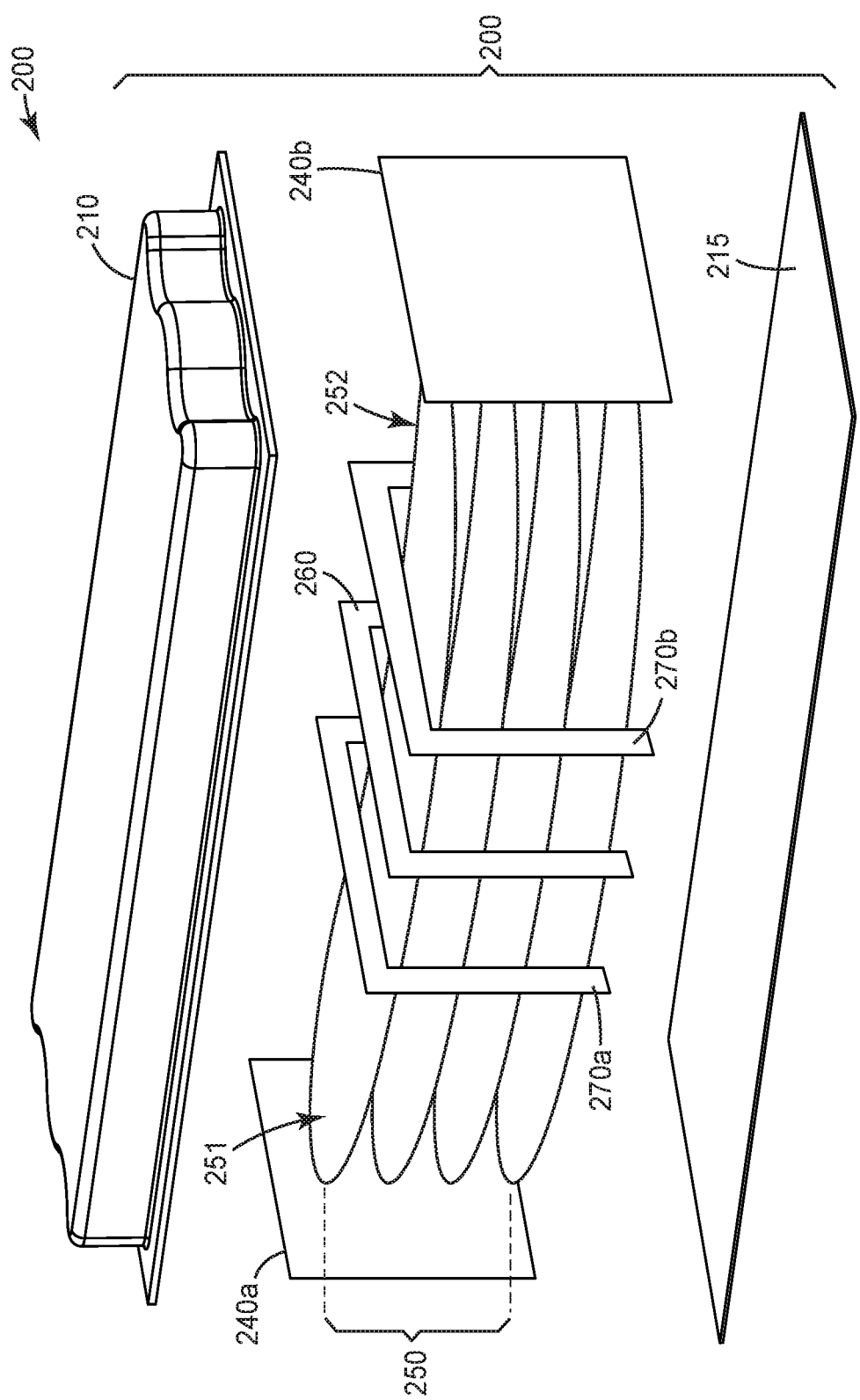
FIG. 3 is a side view of a magnetoelastic resonator device according to another aspect of the invention.
Figure 3B:
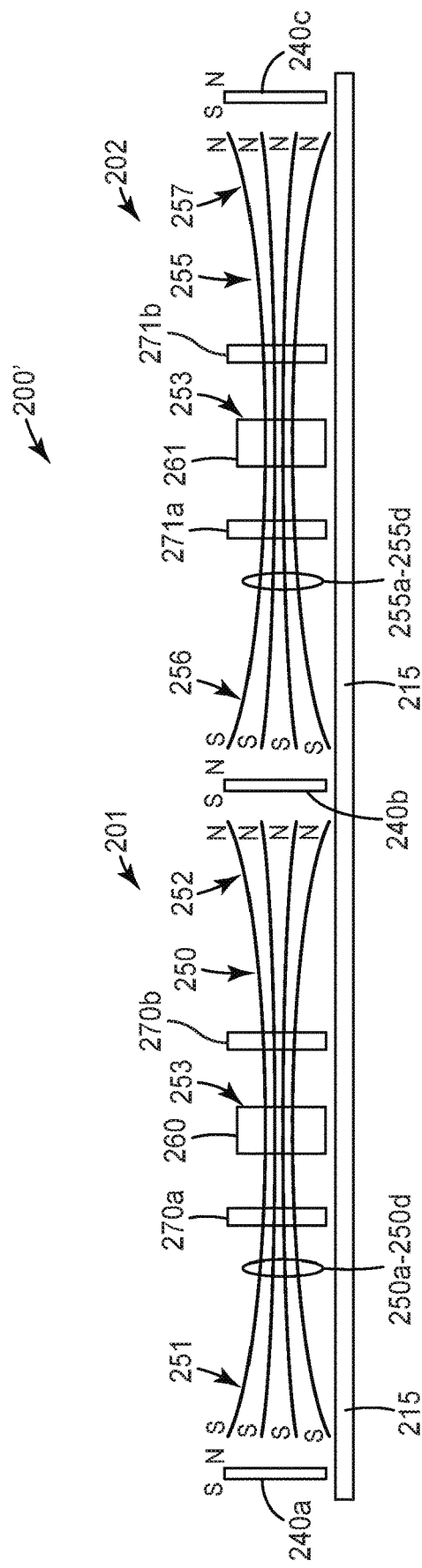

Alternative marker device constructions are shown in FIGS. 3A and 3B. For example, FIG. 3A shows another aspect of the present invention, MEL marker device 200. MEL marker device 200 includes a plurality of elliptically shaped magnetoelastic resonator materials or elements 250 (also referred to herein as resonator strips or ribbons). In this embodiment, the elliptically shaped magnetoelastic resonator elements comprise four elliptically shaped resonator strips 250a-250d disposed in a stacked arrangement, each element having a first lengthwise end 251 and a second lengthwise end 252. While four resonator strips are shown as comprising ferromagnetic element stack 250, the plurality of ferromagnetic elements may comprise a single element, or a stack of 2, 3, 4, 5, 6, 7, 8, or more resonator strips, depending on the conditions.

The resonator strips 250a-250d can be stacked directly on top of each other, or alternatively, one or more spacers, such as glue dots (not shown) can be disposed between resonator strips at the central lengthwise region of the stack 250 such that the strips are not directly in contact with one another at the central region.

In this aspect, resonator strips 250a-250d each comprise a magnetoelastic material with magnetostrictive properties, such as a magnetic amorphous alloy or crystalline material such as Metglas 2826 MB, 2605SA1 or 2605S3A made by Metglas, Inc. of Conway, S.C. Resonator strips 150a-150d can also comprise a similar material, such as those available from Vacuumschmelze GmbH of Hanau, Germany. The physical dimensions, such as the length, width, and thickness, of the resonator strip(s) can be chosen based on the desired response frequency. The ribbons may be annealed or they may be as-quenched material. For strips/ribbons that have a curl along the long axis, the stack of resonant magnetic elements can include some ribbons oriented in a curl-up position, while the remaining ribbons are oriented in a curl-down orientation, thus helping to provide reduced potential frequency shifting when rotated along the long axis in the horizontal orientation. In some aspects, each of the magnetoelastic elements comprises an elliptically shaped, or substantially elliptically shaped magnetoelastic metal strip having a major axis length of about 25 mm to 40 mm. In another aspect, each of the elements comprises a metal strip having a major axis length of about 40 mm to 65 mm.

This construction is different from the marker constructions described above with respect to FIGS. 1 and 2 in that devices 100, 100' provide bias magnets that are disposed underneath, above, or to the side of a resonator strip or strips. Instead, MEL marker device 200 includes bias magnetic elements disposed at each end of the resonator element stack. As shown in FIG. 3A, a first bias magnetic element, such as bias magnet 240a is disposed adjacent to end 251 of the resonator element stack and a second bias magnetic element, such as bias magnet 240b is disposed adjacent to end 252 of the resonator element stack. The magnetic axes of the bias magnets 240a, 240b are set in the same general direction along the ribbon stack long axis. This magnetic element bias orientation can help reduce the effects of gravity on the ferromagnetic element stack (for example, if a bias magnet is placed above one or more ferromagnetic elements, gravity will act to pull the element(s) away from the bias magnet). With the end bias configuration described herein, even if the MEL marker device is flipped upside down, the signal from the resonator element stack 250 will not be significantly impacted.

Further, in some aspects, the end bias configuration, and the use of bias magnets of comparable width to the resonator minor axis, is preferable for the elliptical plate resonator. This is due to the fact that the interior magnetization is more uniform when placed in a more uniform field, and the larger end bias magnet improves this aspect. Further, the ellipse represents an improvement over the rectangular shape for gravity effects. There is relatively less mass on the ends, and a rather stiffer central section due to the elliptical shape. These shape changes lead to a stiffer beam with less gravity induced bending.

Bias magnetic elements 240a, 240b can each comprise a permanent magnet or a magnetically hard or semi-hard metal strip. A magnetically hard magnetic bias material that is not readily changeable can be utilized herein because its bias characteristics are unlikely to change when buried underground. The magnetic bias layer 240 can be made from any magnetic material that has sufficient magnetic remanence when magnetized to appropriately bias the resonators, and sufficient magnetic coercivity so as to not be magnetically altered in normal operating environments. A commercially available magnetic material such as Arnokrome™ III from The Arnold Engineering Company of Marengo, Ill., can be utilized, though other materials could serve equally well. For example, in one particular aspect, the dimensions of the bias magnets (Neodymium magnets available from K&J Magnetics Inc.) can be about 1/16" (thickness), 1/8" (height), and 1/4" (width) with magnetization through the thickness. Of course, bias magnet dimensions can vary based on resonator element size and width. As with linear or bar magnets, magnetic bias elements 240a, 240b can each have magnetic poles, one at each end, as indicated by the N and S designations (see e.g., FIG. 3B).

In another aspect, MEL marker device 200 can include field concentrators disposed between the bias magnetic elements and each end of the resonator element stack. The field concentrators help collect and direct the magnetic field from the bias magnetic elements towards the ends of the resonator element stack. This configuration can be less susceptible to position errors and allows for a greater distance/separation from the resonator element stack ends and can help provide straighter flux lines and less magnetic attraction force. In addition, using a field concentrator allows for the use of a smaller permanent magnet as a bias magnetic element, which helps reduce component cost. Further, in the case of the elliptical plate resonator, the increased bias field uniformity due to the field concentrator is useful in improving the internal field uniformity, as described above.

In construction of both markers and sensors, some means of retaining resonators in the package is required. While there are a number of potential methods for holding the resonators, we describe herein a few possibilities that are not considered limiting for this invention, and other means not described herein could also be used to retain the resonators within the device, as would be apparent to one of ordinary skill in the art given the present description. For example, MEL marker device 200 can further include a clamping element 260 disposed in a central lengthwise region of the resonator element stack 250. The clamping element 260 restricts the displacement of the ferromagnetic elements 250a-250d with respect to each other at the clamping element position. The clamping element 260 can comprise a rigid element or frame-like structure, such as shown in FIG. 3A. In a further aspect, the clamping element 260 can be formed from a magnetic material or a set of small magnets. Alternatively, the clamping element 260 can comprise one or more pins that are inserted through each strip 250a-250d. Using a central pin as a clamping element can also help prevent lateral displacement of one or more of the resonator elements towards one of the end bias magnets. If one or more of the individual resonator elements move slightly from the exact center position, the attraction force becomes stronger and will pull some of the individual resonator elements to one end over time, which can reduce Q and signal strength.

With the bias magnetic positioning shown in FIG. 3A, the ribbons/strips 250a-250d in the resonator stack 250 become magnetized while subjected to the bias magnetic field from each end. This configuration creates repulsion forces between all the ribbons/strips 250a-250d at each end causing the ribbon/strip ends to flare or fan out when the resonator stack is held together in the central region by clamping element 260, while at the same time, all the ribbon ends are subjected to an attraction force towards the magnetic bias elements along the long axis of the ribbon/strip. This creates a pull force along the long axis of the ribbons/strips and a cross repulsion force, causing an air suspension of all the ribbon ends at end regions 251, 252 with no surface contact between the ribbons/strips at end regions 251, 252 (surface contact is expected in the central region when held by clamping element 160, except when using spacers between the ribbons/strips), regardless of the initial curl of the ribbons/strips 250a-250d.

In one aspect, the clamping element 260 is configured to suspend each ferromagnetic element from each other at the central lengthwise region. In another aspect, the clamping element 260 can include a shock absorbing feature to help reduce resonator element stack movement when the MMR is subjected to large vibrations during transport or installation.

In this manner, when exposed to an external magnetic field at a particular frequency, the resonator strips couple to the external magnetic field and convert the magnetic energy into mechanical energy, in the form of magneto-mechanical oscillations of the resonator strips. As the central portion of the stacked arrangement 250 is restricted from displacement by clamping element 260, the first and second ends of each resonator element 250a-250d can experience a flaring movement. Under the bias magnetic field, first ends 251a-251d can flare away from one another at one end of the element stack and second ends 252a-252d can flare away from one another at the second end of the element stack.

In operation, MEL marker device 200 resonates at its characteristic frequency when interrogated (using e.g., a portable locator) with an alternating magnetic field tuned to this frequency. Energy is stored in the marker during this interrogation period in the form of both magnetic and mechanical energy (manifested as resonator vibrations). When the interrogation field is removed, the resonator continues to vibrate and releases significant alternating magneto-mechanical energy at its resonant frequency that can be remotely sensed with a suitable detector, which can be incorporated within the same portable locator. Thus, MEL marker device 200 can be located by exciting it with an external alternating magnetic field where energy is stored in the marker, and then detecting the magnetic field generated by the marker device as it dissipates its stored energy exponentially, at its own resonant frequency. Such a response alerts a locating technician to the presence of MEL marker device 200.

Another consideration with locator systems is that system response time has a limit related to worker efficiency, which limits the minimum bandwidth in the locator receiver. When a technician uses a handheld locator for locating buried markers, it is advantageous to have a fast response for work efficiency.

A further consideration is that the maximum transmitter output power may be limited by radio authorities, as well as battery weight and size.

Therefore, a high gain MEL marker device that is stable in frequency and gain over environmental conditions is advantageous for maximizing the worst case detection distance of a buried marker or cluster of markers, irrespective of locator output power.

When multiple MEL marker devices are used to amplify the response, higher gain is achieved by highly stable markers as well as configurations that vary in a predictable manner where all the markers in a cluster would shift substantially the same amount and continue to add as a function of the number of markers in a cluster, instead of, in a worse case, subtracting from each other due to phase reversal.

For sensing applications, it is advantageous to have a design such as provided in the described embodiments herein in order to have a higher stability and predictability, and therefore a higher sensitivity marker.

There are several specific performance related characteristics, frequency, signal and Q, that can be optimized with an MEL marker locator system, with each having its own advantages depending upon the specific application and detection criteria. In many applications, the orientation and rotation of an MEL marker device cannot be controlled. The earth's magnetic field adds to the ribbon bias field as a vector, increasing or reducing it by up to +/−0.6 Oe. This causes a reduced frequency shift when a higher order resonator stack is used. As observed, the earth's gravitational pull of the suspended ribbon has a higher effect on long ribbons, which are necessary for some frequency ranges. Therefore, it is advantageous to construct and configure the MMR marker as described herein to obtain a consistent performance in all orientations. Further, as will later be shown in FIG. 6, the elliptical plate resonator becomes more frequency stable in the face of bias field changes (such as rotation in the earth's field) at the high gain region, whereas, rectangular resonators become more sensitive in the high gain region—in the sense of part to part variability.

In one aspect of the invention, MEL marker device 200 can further include additional displacement restraints 270a and 270b respectively disposed between the central region and respective ends 251 and 252 of the element stack 250. In one aspect, the additional displacement restraints 270a, 270b can be positioned along the resonator stack 150 at approximately ⅓ the distance between the central region and each respective end 251, 252. Alternatively, in another aspect, the additional displacement restraints 270a, 270b can be placed closer to the resonator stack ends 251, 252. Each of the displacement restraints 270a, 270b limits an amount of the flaring movement of the resonator stack. As such, the displacement restraints 270a, 270b can be sized to allow for some separation between the elements, meaning that the ribbons/strips 250a-250d may not be in contact with one another. The additional displacement restraints help reduce the bending of ribbons/strips of longer lengths (and high order stacks) due to gravity pull. The displacement restraints 270a, 270b can be formed from a rigid plastic material and operate to reduce signal frequency changes when the orientation of the MEL marker device (with respect to the ground surface) is changed.

In an alternative aspect of the invention the resonator stack 250 may include resonator strips having a curl along the long axis (a processing effect due to quenching on a cold wheel), where a first set of resonator strips are oriented "curl up" and a second set of resonator are oriented "curl down." The resonator strips can be stacked such that half of ribbons are curled down and half of the ribbons are curled up, with the adjacent curls being away from each other, in an alternating manner. This arrangement can provide further frequency stability in any orientation, where the resonator stack will have overall symmetry in the up and down rotations. With this orientation, the ribbons closest to the top and bottom covers can be used to limit the overall stack ribbon movement due to gravity (some slight touching may occur).

In another aspect, MEL marker device 200 can further include a substrate 215 to support the other components of the MEL marker device, such as the end bias magnets 240a, 240b and central clamping element 260. The substrate 215 can thus maintain the distance of the bias magnets 240a, 240b from the stacked element ends 251, 252. The substrate 215 can be formed from a flexible plastic material, such that the MEL marker device can be bent (such as when affixed to a flexible pipe).

As shown in the exploded view of FIG. 3A, MEL marker device 200 can further include a housing or cover 210. Housing or cover 210 is configured to enclose the aforementioned marker components. The housing 210 and substrate 215 can be formed from a plastic or any other non-conductive material, such as PVC, or other polymers. In one aspect, the housing can be formed using a conventional vacuum forming process. In a preferred aspect, the housing material can maintain its shape and spacing around the resonator strip and bias material. In addition, the housing and component material can be formed as a non-rigid or flexible structure (e.g., it can be corrugated), either as a result of material composition or thickness of the housing walls. Also, the housing can have a low profile. For example, a corrugated housing can provide higher strength than a flat housing and can flex, making the product suitable for direct bury applications and on plastic pipe applications.

In an alternative aspect of the invention, the MEL marker device 200 can be placed within a protective capsule or outer housing designed to withstand rugged conditions. The protective capsule can be formed from a rugged material such as high density polyethylene (HDPE).

As with devices 100, 100' described above, MEL marker device 200 can be disposed on or near an underground asset, such as a pipe, conduit, or other facility, or otherwise utilized as previously described.

In another aspect of the invention, FIG. 3B shows MEL marker device 200', which is formed as a linear array of MEL marker devices 201 and 202. In this array construction, MEL marker devices 201, 202 share an end bias magnetic element 240b. Optionally, the MEL marker devices 201, 202 can also share a common substrate 215. As would be apparent to one of ordinary skill in the art given the present description, an alternative linear resonator array construction having three, four, five or more markers, each sharing at least one end bias magnet with another MMR marker, can also be utilized. This linear array construction can provide a higher signal (approximately proportional to the number of markers in an array) while sharing end magnets.

In particular, first MEL marker device 201 includes a plurality of elliptically shaped or substantially elliptically shaped magnetoelastic elements 250. In this aspect, the elements comprise four resonator strips 250a-250d disposed in a stacked arrangement, each element having a first lengthwise end 251 and a second lengthwise end 252. While four resonator strips are shown as comprising element stack 250, the plurality of elements may comprise a stack of 2, 3, 4, 5, 6, 7, 8, or more resonator strips, depending on the conditions. The resonator strips 250a-250d can be stacked directly on top of each other, or alternatively, one or more spacers, such as glue dots (not shown) can be disposed between resonator strip at the central lengthwise region 253 of the stack 250 such that the strips are not directly in contact with one another at the central lengthwise region 253.

Similarly, second MEL marker device 202 includes a plurality of elliptically or substantially elliptically shaped elements 255. In this aspect, the elements comprise four resonator strips 255a-255d disposed in a stacked arrangement, each ferromagnetic element having a first lengthwise end 256 and a second lengthwise end 257. While four resonator strips are shown as comprising ferromagnetic element stack 255, the plurality of ferromagnetic elements may comprise a stack of 2, 3, 4, 5, 6, 7, 8, or more resonator strips, depending on the conditions. The resonator strips 255a-255d can be stacked directly on top of each other, or alternatively, one or more spacers, such as glue dots (not shown) can be disposed between resonator strip at the central lengthwise region 258 of the stack 255 such that the strips are not directly in contact with one another at region 258.

Resonator strips 250a-250d and 255a-255d can each comprise an elliptically shaped magnetoelastic resonator material with magnetostrictive properties, such as the materials described above.

MEL marker devices 201 and 202 each include bias magnetic elements disposed at each end of the resonator element stack. As shown in FIG. 3A, a first bias magnetic element, such as bias magnet 240a is disposed adjacent to end 251 of the first resonator element stack 250 and a second bias magnetic element, such as bias magnet 240b is disposed adjacent to end 252 of the resonator element stack 250.

As mentioned above, in this cluster configuration, end bias magnet 240b is shared by both MEL marker device 201 and MEL marker device 202. Thus, bias magnet 240b is disposed adjacent to end 256 of the second resonator element stack 255 and another bias magnetic element, such as bias magnet 240c is disposed adjacent to end 257 of the resonator element stack 255.

Bias magnetic elements 240a, 240b, 240c can each comprise a permanent magnet or a magnetically hard or semi-hard metal strip, such as the materials described above. In another aspect, one or more of MEL marker devices 201 and 202 can include field concentrators disposed between the bias magnetic elements and each end of the resonator element stack. The field concentrators help collect and direct the magnetic field from the bias magnetic elements towards the ends of the resonator element stack. As mentioned previously, concentrators can improve uniformity and thus performance of elliptical plate resonators.

Further, MEL marker devices 201 and 202 can each include a clamping element, such as clamping element 260 disposed in a central lengthwise region 253 of the resonator element stack 250 and clamping element 261 disposed in a central lengthwise region 258 of the resonator element stack 255. The clamping elements restrict the displacement of the ferromagnetic elements 250a-250d, 255a-255d with respect to each other. The clamping elements 260, 261 can comprise the same materials and structures described above. In addition, one or both of the clamping elements 260, 261 can include a shock absorbing feature to help reduce resonator element stack movement when the MEL marker device is subjected to large vibrations during transport or installation.

In this manner, when exposed to an external magnetic field at a particular frequency, the resonator strips couple to the external magnetic field and convert the magnetic energy into mechanical energy, in the form of magneto-mechanical oscillations of the resonator strips. As shown in FIG. 3A as the central portion of the stacked arrangements 250, 255 are restricted from displacement by clamping elements 260, 261 the first and second ends of each resonator element 250a-250d, 255a-255d experience a flaring movement. As shown in FIG. 3A, under the bias magnetic field, first ends of resonator stacks 250, 255 are flared away from one another at one end of the respective element stacks and the second ends are flared away from one another at the respective second ends of the element stacks.

MEL marker devices 201, 202 can each further include additional displacement restraints, such as described above. For example, for MEL marker device 201, additional displacement restraint 270a can be disposed between first end 251 and central region 253 and a second displacement restraint 270b can be disposed between second end 252 and central region 253 of the element stack 250. Similarly, a displacement restraint 271a can be disposed between first end 256 and central region 258 and a second displacement restraint 271b can be disposed between second end 257 and central region 258 of the element stack 255. Displacement restraint positioning along the resonator element stack can be similar to that described above with respect to MEL marker device 200. The displacement restraints can be constructed in a manner similar to that described above.

As mentioned above, in one aspect, MEL marker devices 201, 202 can share a common substrate 215 to support the other components of the MMR markers. In an alternative aspect, each MEL marker device 201, 202 can have a separate substrate. The substrate 215 can be formed from a flexible plastic material, such that the cluster MEL marker device 200' can be bent (such as when affixed to a flexible pipe).

In addition, cluster MEL marker device 200' can further include a housing or cover configured to enclose markers 201, 202. The housing can be constructed in a manner similar to the housings described above. In an alternative aspect of the invention, cluster MEL marker device 200' can be placed within a protective capsule or outer housing designed to withstand rugged conditions. The protective capsule can be formed from a rugged material such as high density polyethylene (HDPE).

As with previous embodiments, MEL marker device 200' can be disposed on or near an underground asset, such as a pipe, conduit, or other facility. For example, an MEL marker device 200' can be a stand-alone marker, it can be physically attached to an underground asset, such as a pipe or other utility, or it can be attached to another device, such as caution or warning tape, located at or near the underground asset. In addition, the marker devices described herein can be utilized in non-underground environments, such as for use in locating and identifying above-ground assets otherwise hidden from view (such as in a container or within a building wall, ceiling, or floor).

As described above, MEL marker devices can be specifically designed to operate at different frequencies which are associated with unique asset types such as different utility infrastructure (e.g., water, waste water, electric, telephone/cable/data, and gas).

A portable locating device can be used to detect the MMR markers described herein. An exemplary portable locating device is described in US 2012/068823, incorporated by reference herein. Such a locating device can comprise a single antenna that is used to generate an electromagnetic field and to detect a response of the MMR marker 100, 100', 200. In an alternative aspect, the portable locating device can comprise multiple antennas, where one antenna could be used for generating an electromagnetic field and a second antenna could be used for detecting the response of the MMR marker to the generated field. The locating device can be battery powered for better portability. An integrated display can provide a user with a variety of information about located MMR markers and the assets that the MMR markers are associated with. For example, the display can provide information about marker and asset depth, direction, or other information about the MMR markers. Exemplary portable locating devices include the 3M™ Dynatel™ 1420 Locator and the 3M™ Dynatel™ 7420 Locator, both distributed by 3M Company of St. Paul, Minn. In one embodiment, the locating device firmware can be programmed so as to tune the locator antenna to radiate a particular, or several particular desired frequencies.

In alternative aspects, the MEL marker devices described herein can be utilized as part of a sterilization indicator system that provides time, temperature, and/or chemical information. In a further alternative aspect, the MEL marker devices described herein can be utilized as part of a perishable (e.g., food spoilage) indicator system that provides time and temperature information. In a further alternative aspect, the MEL marker devices described herein can be utilized as part of a leak detection system that provides leak information for above or below ground utilities. Alternatively, the MEL marker devices described herein can be designed to be physically affected by changing conditions so that a signal response may vary over time or conditions, indicating certain information to the user.

Experiments

A series of Experiments were performed comparing various attributes of elliptically shaped resonator materials against conventional rectangularly shaped resonator materials. The resonator materials were provided by Metglas (Metglas 2826MB3, center cut, not annealed) and were either laser cut (Ellipse samples and LC SQ (about 0.48"× 1.68") rectangular samples) or shear cut (SH SQ (0.45"× 1.68") rectangular samples). Resonant frequencies between ellipse and rectangle samples were within 2%, and the mass of each sample was within 10% (the ellipse was 9% heavier than the rectangle samples). Aspect ratios and sizes were kept similar (the ellipse was slightly longer), as discussed previously in describing geometrical comparison of ellptical plates and rectangular plates from a practical application viewpoint.

Generally, experiments were designed so that differences in resonator performance can be attributed to shape, and less dependent on other factors. Generally, the magnetostriction of the as-cast ribbon varies in the cross-web direction. For this reason, the same lot of material was used (to eliminate lot to lot variation), and both rectangular resonators and ellptical plate resonators were cut from the very center of the web for the orientiation of the resonator long axis.

In order to attribute differences to shape, both laser and shear cut rectangular samples were cut. The ellptical shape was best cut with a laser, as dies of this shape are hard to produce and maintain sharpness. For the shear cut samples, a guillotine shear was expertly sharpened and blade preloading was optimized. Several samples of each type were cut. Baseline measurements of dynamic parameters were taken and the 4 highest performing of each design were used to produce average and standard deviations. Highest performance criteria is based on overall signal gain, using the measurement technique as described below.

Resonators were tested in a dual coil arrangement, with a larger Helmholtz coil for the DC bias field, and a smaller AC coil for measuring dynamic parameters. Dynamic parameters were measured using a motional admittance method in the complex plane (see "Electroacoustics", by Frederick Hunt, for a description of the complex plane analysis of resonators using motional impedance or motional admittance). The data were acquired using a network analyze with reflection bridge (HP 3577A). A slow sweep (30 seconds) was used to allow for precise, steady state conditions indicative of the material response, as opposed to a combination of materials and equipment parameters. The equivalent ring down response for a specified charge up time and ring down time can be calculated from this data using the measured frequency and Q using standard equations. The data comparisons herein are the full steady state solutions.

Experiment 1

A first experiment was performed comparing the relative gain of a marker device having an elliptically shaped resonator strip versus two different marker devices having rectangularly shaped resonator strips. The curve labeled "Ellipse" represents the gain of a marker device having an elliptically shaped resonator material in the test setup as described. The resonator strip was shaped using laser cutting. The ellipse sample has a resonant frequency at about 49 KHz. The curves labelled LC SQ Gain and SH SQ Gain represent the gain from a laser cut (LC) and a shear cut (SH) rectangular shape (SQ).

Figure 4:
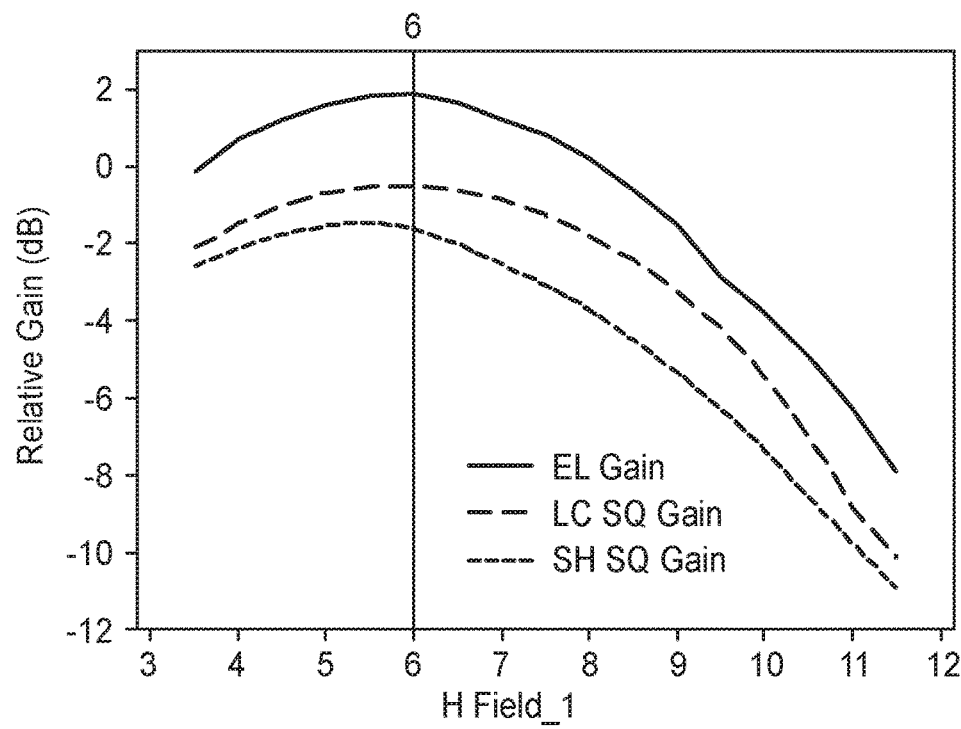
FIG. 4 is a plot showing the relative gain of a marker device having an elliptically shaped resonator strip versus two different marker devices having rectangularly-shaped resonator strips.

The results are shown in FIG. 4.

These results are an average of the best 4 of 10 (9 for ellipse) resonators of each type. This "top 40%" approach was taken to mitigate effects of material and process variation in the comparison.

Relative gain is measured as a function of H field. As can be observed in FIG. 4, the laser cut ellipse is the highest gain construction at all bias field values, peaking at around 5.5 to 6 Oe. The gain increase may be both due to shape and cutting process, but these are not necessarily additive, as there is likely an interaction between shape and process. The 3.3-3.6 dB increase as seen in a single resonator is a significant increase given the material variation. For the rectangular shapes, the laser cut (LQ) is somewhat superior to the shear cut (SH) resonator. In general, cutting methods can vary in quality, due to particular process parameters and mechanical condition of the shear. In the present experiment, it is observed that the ellipse shows an improvement beyond that indicated by cutting method alone.

Experiment 2

Figure 5:
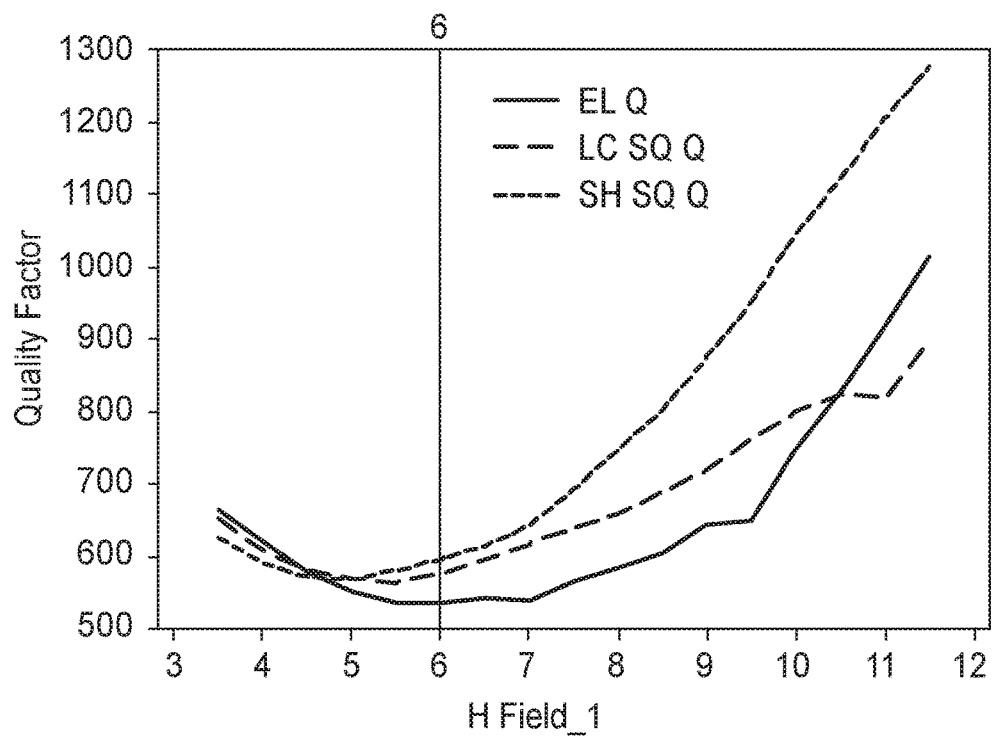
FIG. 5 is a plot of resonator Q is measured as a function of bias field for different resonator shapes.

A second experiment was performed, where resonator Q is measured as a function of bias field. The samples are the same as in Experiment 1. The results are shown in FIG. 5.

As is observed, in the high gain region, near 6 Oe, there is little notable difference in Q. At higher bias, the ellipse's Q factor is lower. This is not surprising, as the ellipse shows stronger energy transfer from magnetic to acoustic energy, and the "intrinsic Q" is understood to be inversely proportional to this quantity.

Experiment 3

A third experiment was performed, where standard deviation of a 4 sample population in Frequency was measured as a function of bias field. The samples are the same as in Experiment 1. In these calculations, the shear cut sample has been length corrected mathematically so that the variation in frequency is due to material variation alone. The results are shown in FIG. 6.

Figure 6:
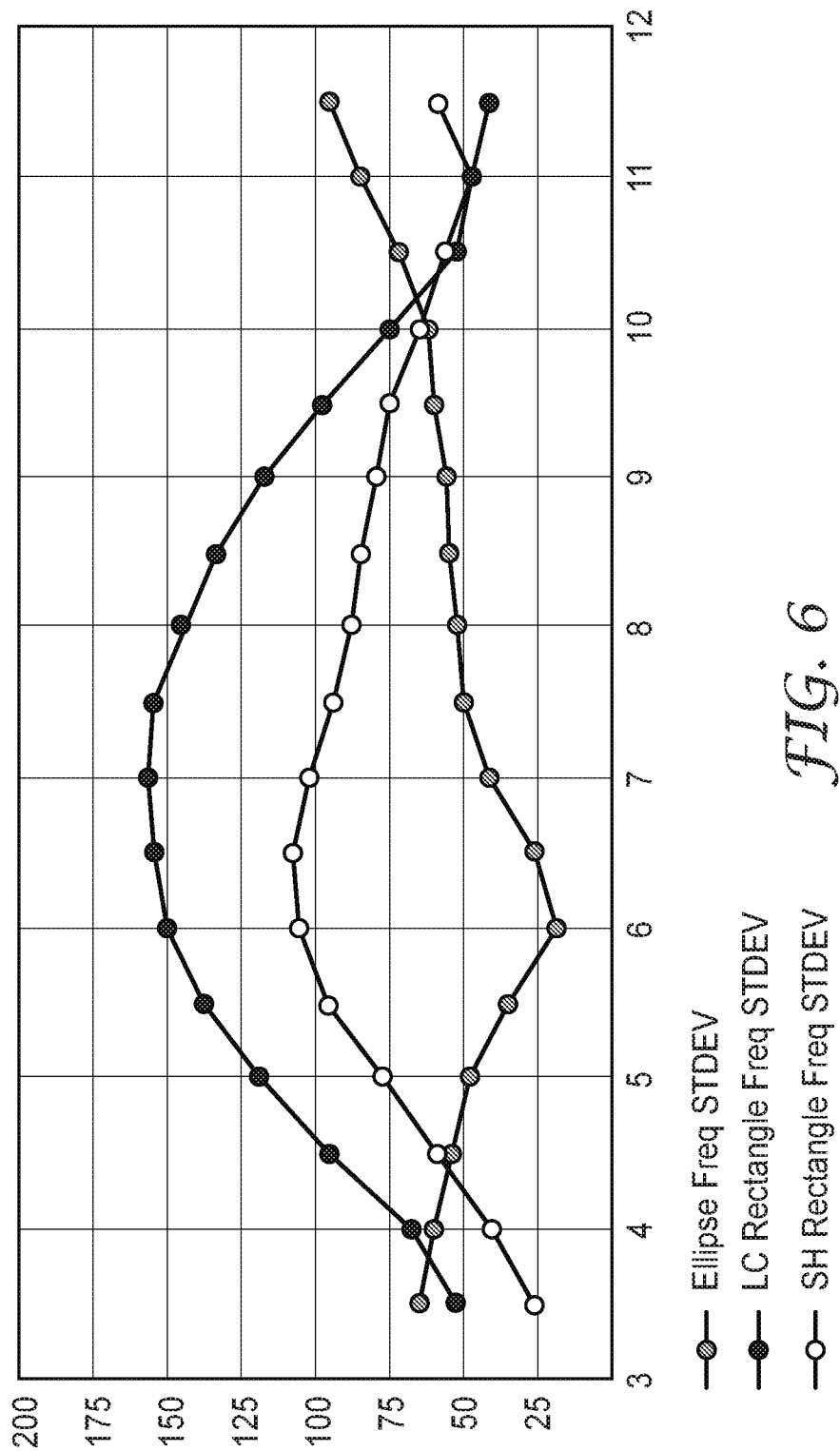
FIG. 6 is a plot of standard deviation of a 4 sample population in Frequency as a function of bias field for different resonator shapes.

FIG. 6 shows that both rectangular samples become more sensitive to variation from sample to sample as the high gain region is approached, and peaks from 6.5 to 7 Oe. In contrast, the elliptical resonator becomes less sensitive to variation at the high gain point of 6 Oe. As observed, there is a decrease in variation of frequency from 100-150 Hz to less than 25 Hz. This property is useful in both markers and sensors. For markers, it can reduce variation of single resonators from part to part, and make resonators more consistent within a stacked or linear array of resonators. This can also be significant for manufacturing variation, and for detection systems in MMR sensors.

Experiment 4

Figure 7:
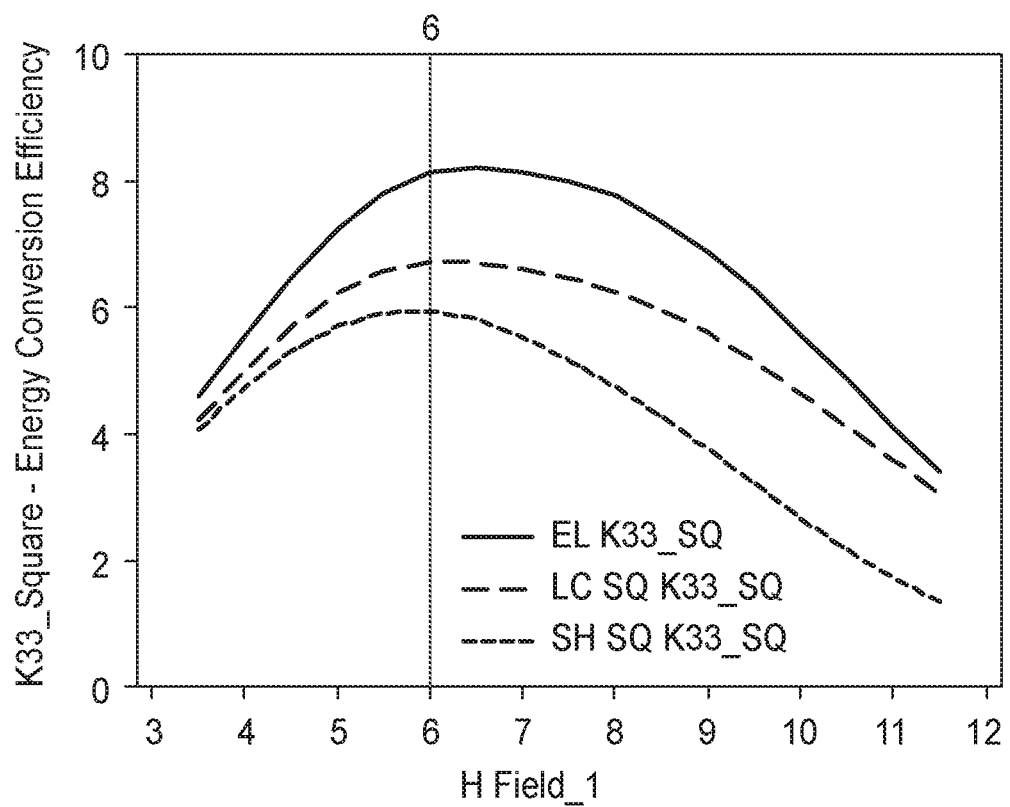
FIG. 7 is a plot of the energy conversion efficiency ($K_{33}^2$ value) measured as a function of bias field for different resonator shapes.

A fourth experiment was performed, where the energy conversion efficiency ($K_{33}^2$ value, sometimes called coupling coefficient square) is measured as a function of bias field. The samples are the same as in Experiment 1. The results are shown in FIG. 7.

It is observed that the sequence seen in the gain curve (FIG. 4) is also reflected in the relative order for the energy conversion efficiency. It is observed that the H external field to B internal field conversion is 21% more effective for the ellipse sample as compared to the shear cut rectangle sample. As mentioned above, the B field is more uniform for the ellipse and does not roll off near the ends, as it does for a rectangle. Thus, the energy transfer from magnetic to acoustic is stronger in the ellipse, likely due to the uniform field effect. This increase in $K_{33}^2$ directly impacts the improved signal gain, as the gain is proportion to the logarithm of the product of $K_{33}^2$, Q, and the effective reversible permeability. While the ellipse showed a slightly lower Q value, the energy conversion efficiency is notably improved.

Experiment 5

Figure 8A:
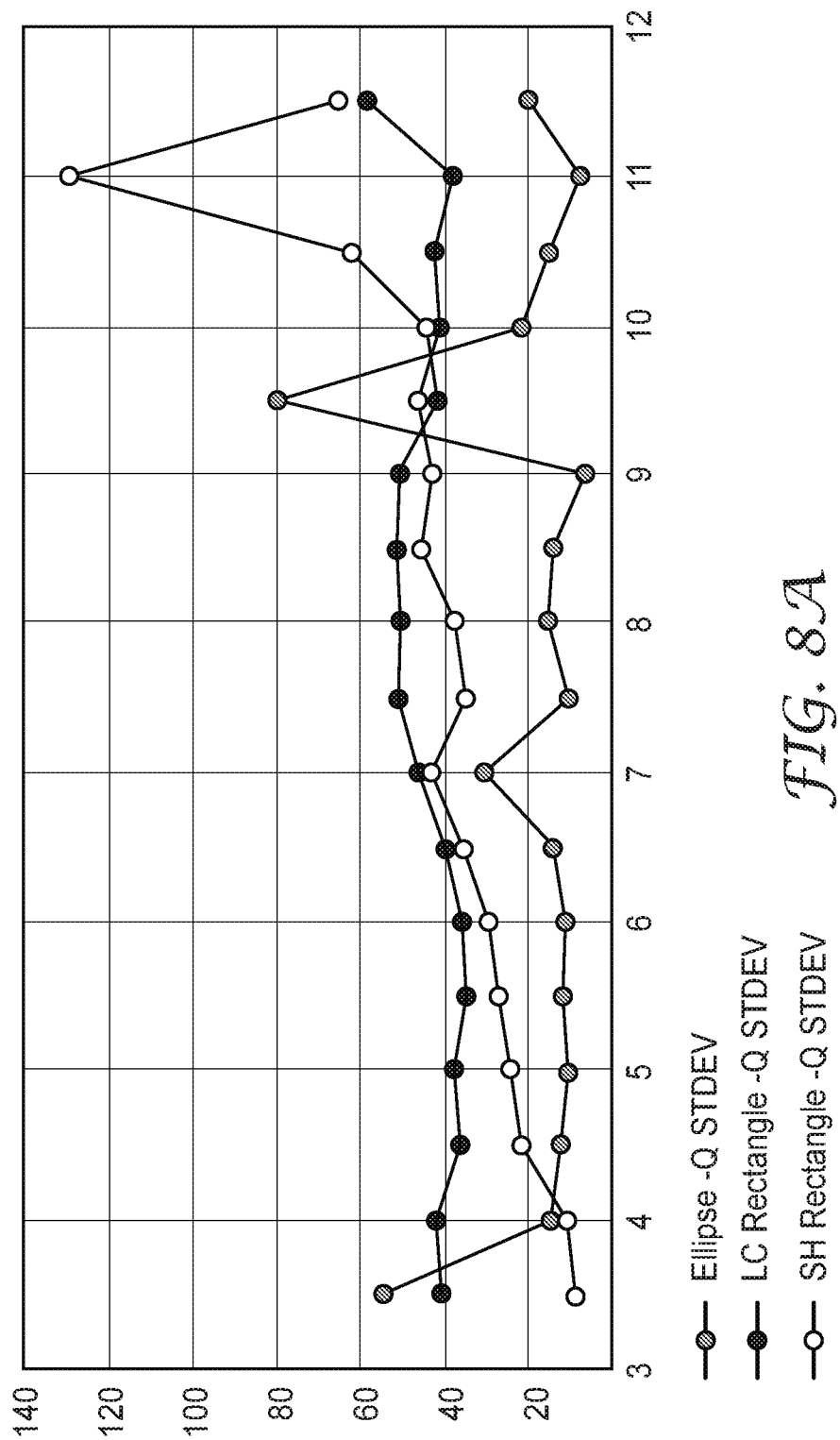
FIGS. 8A-8C are plots of standard deviations of Q, Gain, and Energy Conversion Efficiency measured as a function of bias field for different resonator shapes.
Figure 8B:
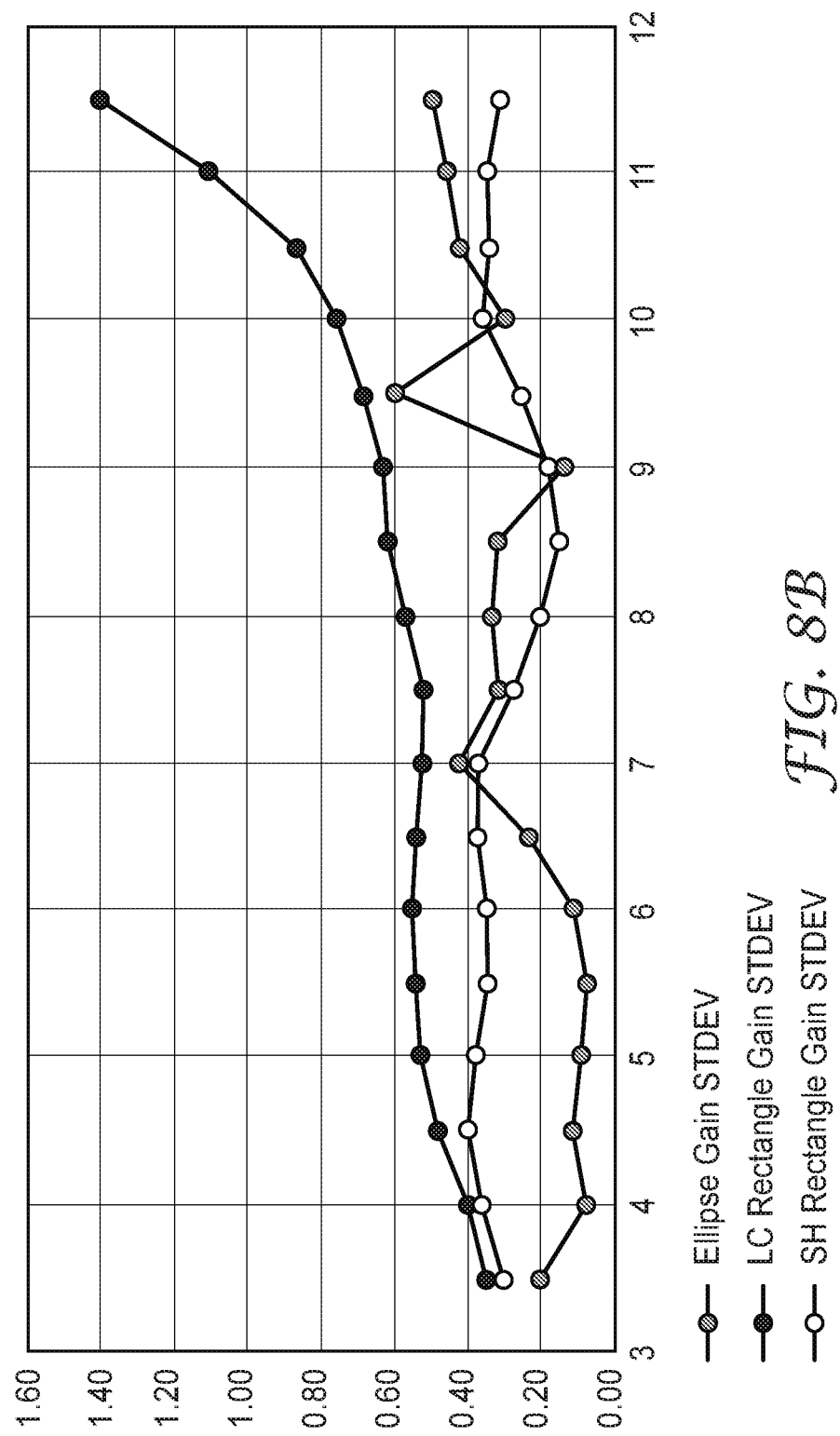
Figure 8C:
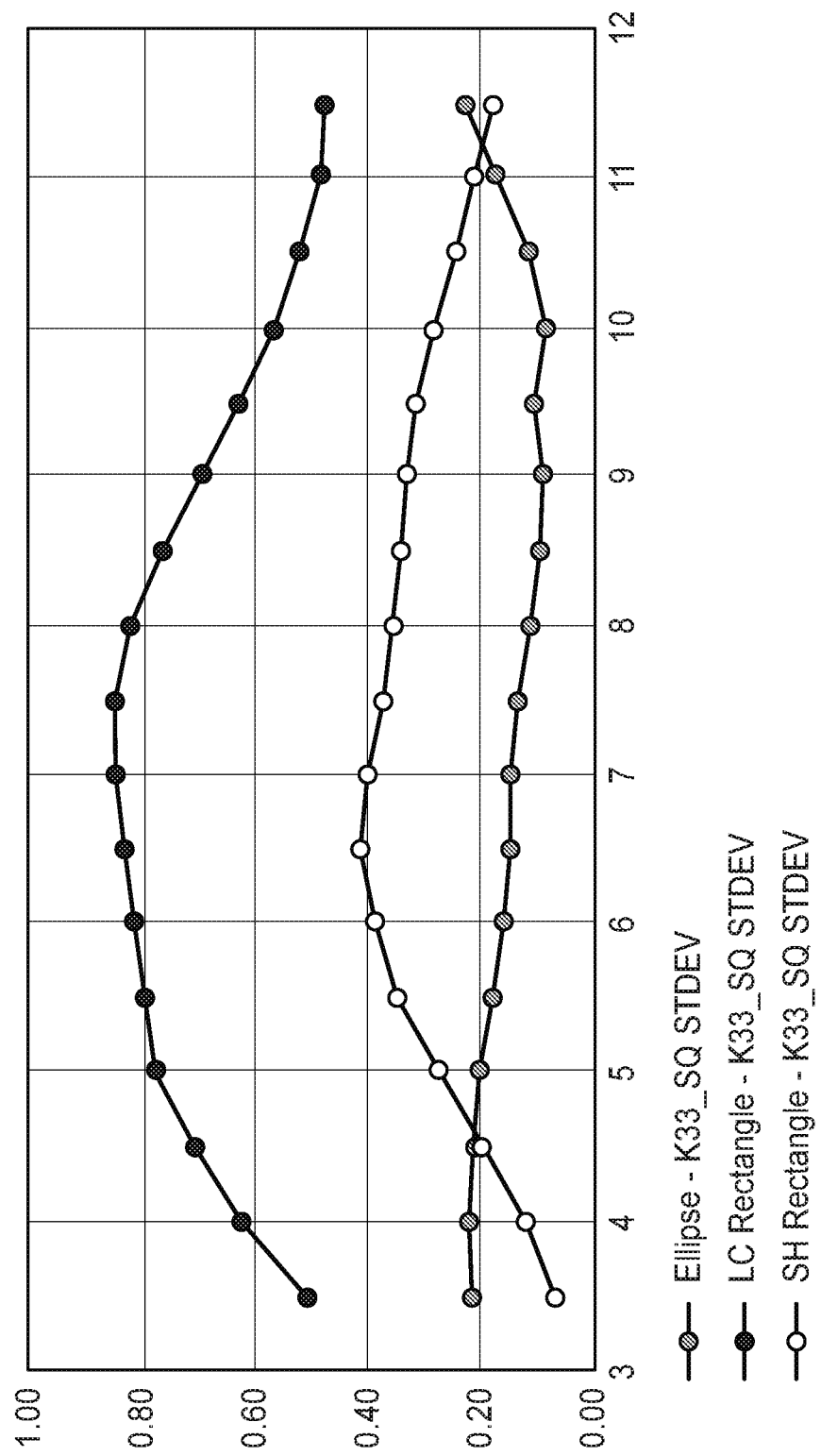

A fifth experiment was performed, where standard deviations of Q, Gain, and Energy Conversion Efficiency were measured as a function of bias field. The samples are the same as in Experiment 1. The results are shown in FIGS. 8A-8C. Note that the vertical scale for each plot is different.

In FIG. 8A, it is observed that the Q variation is small for all resonators, with the ellipse being more consistent overall than the rectangular resonators.

In FIG. 8B, it is observed that the gain variation is relatively small for all resonators. It is also observed that the ellipse shows the least variation at peak gain (~60e) by a substantial ratio>4:1.

In FIG. 8C, the energy conversion is more consistent for the elliptical resonator, with both rectangular shapes showing a similar variation (and similar curve shape) with respect to the bias field. An increase in variation for the rectangular shapes in the vicinity of the high gain region is similar to that seen for the frequency variation in FIG. 6. Likewise, the elliptical resonator exhibits a 2-3× lower variation in energy conversion.

Experiment 6

A sixth experiment was performed. In this experiment, the resonator device design was changed, so that elliptically shaped resonator strips and shear cut rectangular resonator strips were each utilized in a stacked array design, similar to the MEL marker device design of FIG. 3A, but biased with the Helmholtz coil in the metrology system. In this experiment, four resonator elements were used in each device. These experiments provide the gain and Q as a function of bias field. The results are shown in FIGS. 9A and 9B.

Figure 9A:
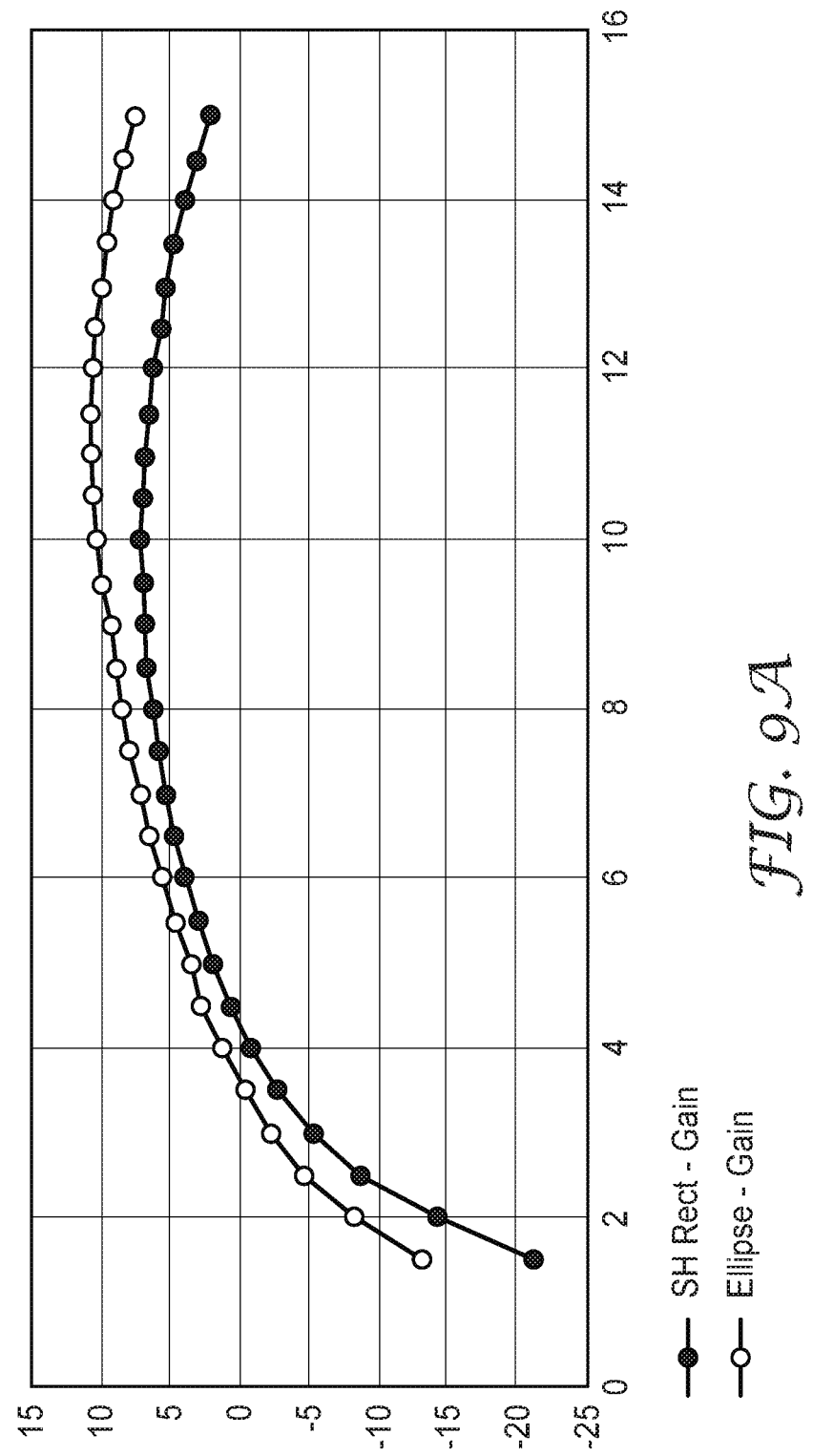
FIGS. 9A and 9B are plots of the gain and Q as a function of bias field for different stacked array resonator shapes.

In FIG. 9A, it is observed that the 3.6 dB gain of the individual resonators is essentially present in the full array gain of the four element stack, but no additional synergistic gain is observed. The ellipse resonator shows higher gain, but at a somewhat higher bias field.

Figure 9B:
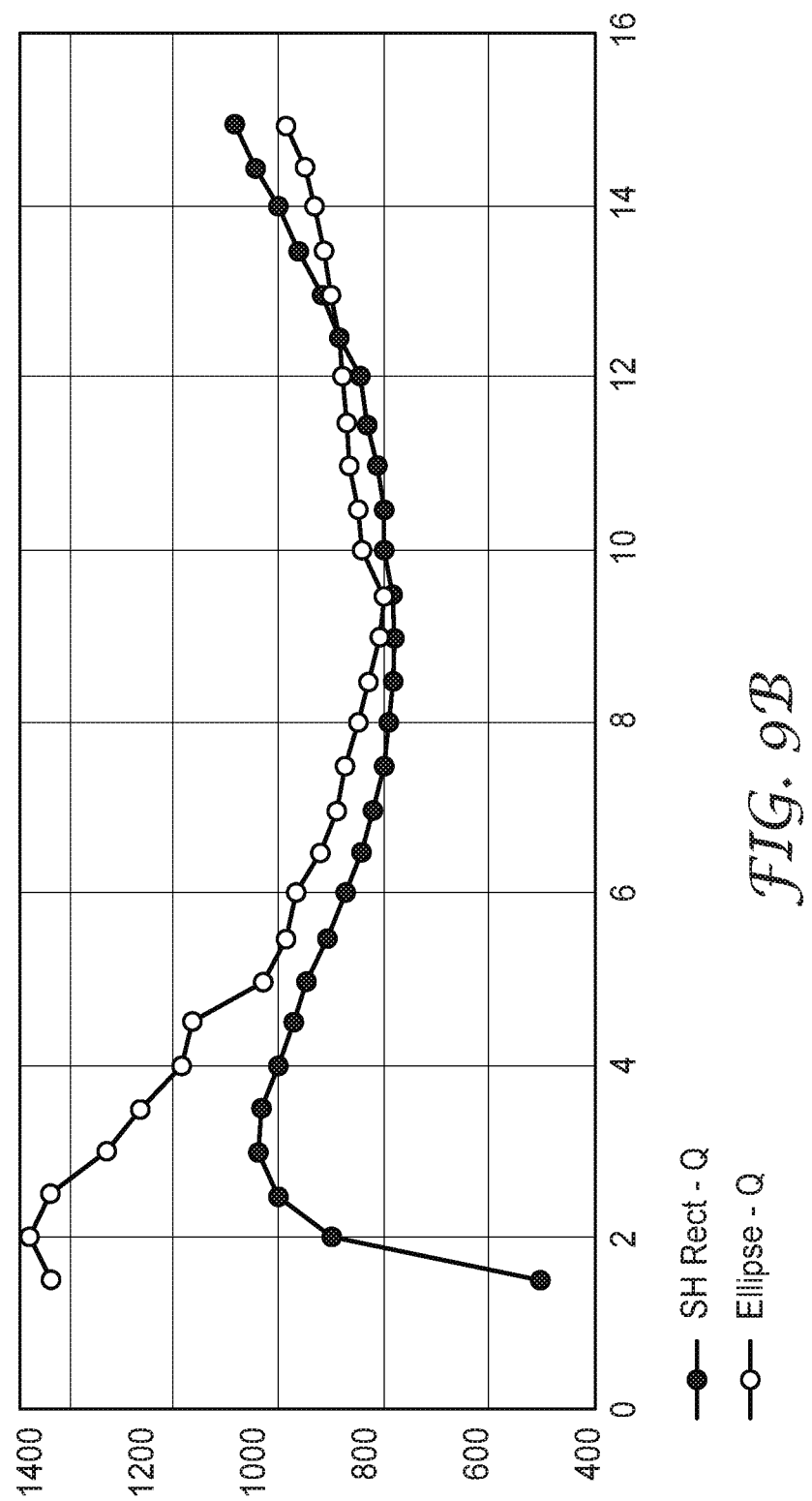

In FIG. 9B, there is no practical difference in measured Q values at the peak gain. This is consistent with the earlier observation that improved energy conversion is mostly responsible for higher signal gain of the ellptical resonator, not significantly higher Q. Clearly, the same effect is demonstrated for the stacked resonator array configuration.

Experiment 7

A seventh experiment was performed. In this experiment, the resonator device design was changed, so that elliptically shaped resonator strips and shear cut rectangular resonator strips were each utilized in a stacked array desing, similar to the MEL marker device design of FIG. 3A, but biased with the Helmholtz coil in the metrology system. In this experiment, four resonator elements were used in each device. These experiments provide the frequency stability of the elliptical and rectangular resonator devices as a function of bias field. The results are shown in FIGS. 10A and 10B.

FIG. 10A shows that both resonator designs are broadly frequency stable over the bias field (with the ellipse being more stable), with the zero frequency derivative being closely matched to peak gain for both resonators.

Figure 10B:
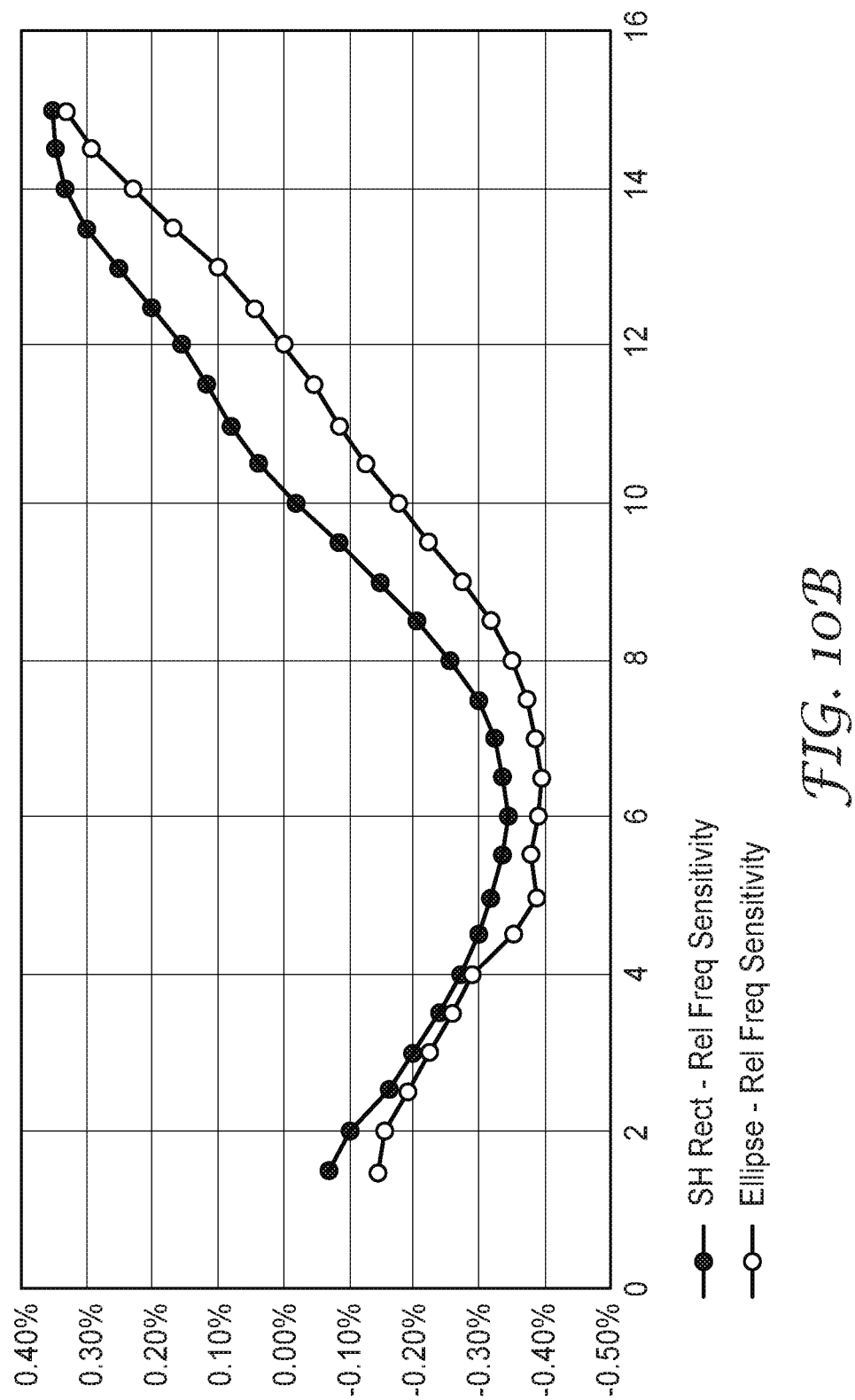

FIG. 10B shows that both resonator designs exhibit excellent frequency sensitivity in the vicinity of their peak gain, but with the ellptical plate showing a somewhat broader minimum, indicating higher stability with bias change. In general, the use of the stacked resonator construct itself also improves frequency stability.

Overall, the actual difference of 3-4 dB of gain (improvement for the elliptically shaped resonator material) comes from: (a) more uniform magnetic field inside the material; (b) shape effect on energy conversion $K_{33}^2$; (c) being slightly wider in shape in the middle of the resonator strip where magnetostriction is larger; and (d) improved coupling of the external DC and AC fields. More importantly, the results show that an elliptical resonator that fits in a similar sized space and oscillates at a similar frequency produces more gain and is more consistent from sample to sample.

Thus, the MEL marker devices described herein can be utilized in many different identification and location applications. For example, an MEL marker device can be a stand-alone marker, it can be physically attached to an underground asset, such as a pipe or other utility, or it can be attached to another device, such as caution or warning tape, located at or near the underground asset. In addition, the MEL marker devices described herein can be utilized in non-underground environments, such as for use in locating and identifying above-ground assets otherwise hidden from view (such as in a container or within a building wall, ceiling, or floor).

The present invention has now been described with reference to several individual embodiments. The foregoing detailed description has been given for clarity of understanding only. No unnecessary limitations are to be understood or taken from it. It will be apparent to those persons skilled in the art that many changes can be made in the embodiments described without departing from the scope of the invention. Thus, the scope of the present invention should not be limited to the details and structures described herein, but rather by the structures described by the language of the claims, and the equivalents of those structures.

The invention claimed is:

1. A magnetoelastic resonator device, comprising:
a housing;
at least one elliptically-shaped or substantially elliptically-shaped magnetoelastic element disposed within the housing;
at least one bias magnet disposed in the housing, wherein the at least one elliptically-shaped or substantially elliptically-shaped magnetoelastic element is configured to couple to an external magnetic field at a particular frequency and convert the magnetic energy into mechanical energy, in the form of oscillations, wherein the at least one elliptically-shaped or substantially elliptically-shaped magnetoelastic element comprises at least two elliptically-shaped or substantially elliptically-shaped magnetoelastic elements in a stacked arrangement; and
a displacement restriction element disposed in a central lengthwise region of the stacked arrangement to restrict displacement of the at least two magnetoelastic elements with respect to each other at the central lengthwise region, wherein the first and second ends experience flaring movement.

2. The magnetoelastic resonator device of claim 1, wherein the elliptically-shaped or substantially elliptically-shaped magnetoelastic element comprises an amorphous magnetic material.

3. The magnetoelastic resonator device of claim 1, wherein the elliptically-shaped or substantially elliptically-shaped magnetoelastic element is shaped via one of laser machining, tool cutting and stamping.

4. A magnetoelastic resonator device, comprising:
at least one elliptically-shaped or substantially elliptically-shaped magnetoelastic element having a first lengthwise end and a second lengthwise end;
a first bias magnetic element disposed adjacent to the first lengthwise end of the at least one elliptically-shaped or substantially elliptically-shaped magnetoelastic element;
a second bias magnetic element disposed adjacent to the second lengthwise end of the at least one elliptically-shaped or substantially elliptically-shaped magnetoelastic element;
a substrate to support the at least one elliptically-shaped or substantially elliptically-shaped magnetoelastic element and first and second bias elements, wherein the at least one elliptically-shaped or substantially elliptically-shaped magnetoelastic element comprises at least two elliptically-shaped or substantially elliptically-shaped magnetoelastic elements in a stacked arrangement; and
a displacement restriction element disposed in a central lengthwise region of the stacked arrangement to restrict displacement of the at least two magnetoelastic elements with respect to each other at the central lengthwise region, wherein the first and second ends experience flaring movement.

5. The magnetoelastic resonator device of claim 4, wherein the displacement restriction element suspends each element from each other at the central lengthwise region.

6. The magnetoelastic resonator device of claim 4, wherein the displacement restriction element comprises at least one pin extending through each of the plurality of ferromagnetic elements.

7. The magnetoelastic resonator device of claim 4, wherein each of the elliptically-shaped or substantially elliptically-shaped magnetoelastic elements comprises an amorphous magnetic material.

8. A linear array magnetoelastic resonator device, comprising:
a first plurality of elliptically-shaped or substantially elliptically-shaped elements disposed in a first stacked arrangement, each element having a first lengthwise end and a second lengthwise end;
a second plurality of elliptically-shaped or substantially elliptically-shaped elements disposed in a second stacked arrangement, each element having a first lengthwise end and a second lengthwise end;
a first bias magnetic element disposed adjacent to the first lengthwise end of the first stacked arrangement;
a second bias magnetic element disposed adjacent to the second lengthwise ends of the first stacked arrangement, wherein the second bias magnetic element is also disposed adjacent to the first end of the second stacked arrangement;

a third bias magnetic element disposed adjacent to the second lengthwise end of the second stacked arrangement;

a first displacement restriction element disposed in a central lengthwise region of the first stacked arrangement to restrict displacement of the plurality of magnetoelastic elements with respect to each other at the central lengthwise region, wherein the first and second lengthwise ends experience flaring movement; and a second displacement restriction element disposed in a central lengthwise region of the second stacked arrangement to restrict displacement of the plurality of magnetoelastic elements with respect to each other at the central lengthwise region, wherein the first and second lengthwise ends experience flaring movement.

9. The magnetoelastic resonator device of claim 8, further comprising a housing to enclose the resonator device.

10. The magnetoelastic resonator device of claim 9, wherein the housing is formed from a non-rigid material.

11. The magnetoelastic resonator device of claim 10, wherein the housing has sufficient flexibility to be mounted to a coiled pipe.

12. The magnetoelastic resonator device of claim 8, wherein the resonator device has a frequency range of from about 34 kHz to about 80 kHz.

13. The magnetoelastic resonator device of claim 8, wherein the resonator device can be detected at a depth up to about 48 inches underground.

14. The magnetoelastic resonator device of claim 8 attached to an asset buried underground.

15. A magnetoelastic resonator marker system comprising:

the magnetoelastic resonator device of claim 1; and a portable locating device.

* * * * *

UNITED STATES PATENT AND TRADEMARK OFFICE
CERTIFICATE OF CORRECTION

Page 1 of 1

PATENT NO. : 10,763,823 B2
APPLICATION NO. : 16/064839
DATED : September 1, 2020
INVENTOR(S) : Curtis Shoemaker et al.

It is certified that error appears in the above-identified patent and that said Letters Patent is hereby corrected as shown below:

In the Specification

Column 16,
Line 33, Delete "(~60e)" and insert -- (~6 Oe) --, therefor.

Signed and Sealed this
Sixteenth Day of February, 2021

Drew Hirshfeld
*Performing the Functions and Duties of the*
*Under Secretary of Commerce for Intellectual Property and*
*Director of the United States Patent and Trademark Office*